(12) United States Patent
Kim et al.

(10) Patent No.: US 7,829,650 B2
(45) Date of Patent: Nov. 9, 2010

(54) POLYMER FOR ORGANIC ANTI-REFLECTIVE COATING LAYER AND COMPOSITION INCLUDING THE SAME

(75) Inventors: Sang-Jeoung Kim, Incheon (KR); Hyo-Jung Roh, Hwaseong-Si (KR); Jong-Kyoung Park, Hwaseong-Si (KR); Jeong-Sik Kim, Hwaseong-Si (KR); Hyun-Jin Kim, Hwaseong-Si (KR); Jae-Hyun Kim, Seoul (KR)

(73) Assignee: Dongjin Semichem Co., Ltd., Incheon (KR)

( * ) Notice: Subject to any disclaimer, the term of this patent is extended or adjusted under 35 U.S.C. 154(b) by 259 days.

(21) Appl. No.: 11/952,324

(22) Filed: Dec. 7, 2007

(65) Prior Publication Data

US 2008/0213701 A1   Sep. 4, 2008

(30) Foreign Application Priority Data

Dec. 22, 2006   (KR) .................. 10-2006-0132668

(51) Int. Cl.
*G03F 7/11*   (2006.01)
*C08G 77/00*   (2006.01)

(52) U.S. Cl. .................. 528/26; 430/272.1; 430/313; 430/271.1; 438/952

(58) Field of Classification Search .................. None
See application file for complete search history.

(56) References Cited

U.S. PATENT DOCUMENTS

| 4,306,990 A | * | 12/1981 | Goodman et al. | ............ 510/238 |
| 4,636,552 A | * | 1/1987 | Gay et al. | ............ 525/63 |
| 4,978,726 A | * | 12/1990 | Dohler et al. | ............ 525/479 |
| 5,061,598 A | * | 10/1991 | Abe et al. | ............ 430/272.1 |
| 5,629,136 A | * | 5/1997 | Higashi et al. | ............ 430/272.1 |
| 6,376,569 B1 | * | 4/2002 | Oxman et al. | ............ 522/29 |
| 2004/0018346 A1 | * | 1/2004 | Jung et al. | ............ 428/195.1 |
| 2005/0031964 A1 | * | 2/2005 | Babich et al. | ............ 430/5 |

FOREIGN PATENT DOCUMENTS

EP   0 282 927 A1 *   9/1988

* cited by examiner

*Primary Examiner*—Cynthia Hamilton
(74) *Attorney, Agent, or Firm*—Birch, Stewart, Kolasch & Birch, LLP

(57) ABSTRACT

A polymer which has siloxane group at a main chain thereof and a composition including the same, for forming an organic anti-reflective coating layer are disclosed. The polymer for forming an organic anti-reflective coating layer is represented by following Formula.

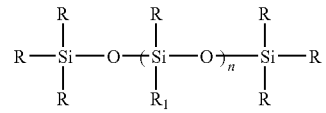

In Formula, R is hydrogen atom, $C_1$~$C_{20}$ alkyl group, $C_1$~$C_{10}$ alcohol group or epoxy group, $R_1$ is independently hydrogen atom,

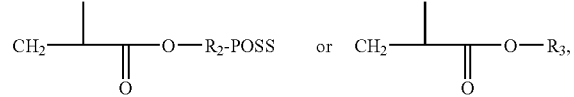

n is an integer of 1-50, $R_2$ is $C_1$~$C_{20}$ alkyl group, $C_3$~$C_{20}$ cycloalkyl group, $C_6$~$C_{20}$ aryl group or $C_7$~$C_{12}$ arylalkyl group, $R_3$ is hydrogen atom, $C_1$~$C_{10}$ alcohol group or epoxy group and POSS is a polyhedral oligosilsesquioxane.

1 Claim, 1 Drawing Sheet

POLYMER FOR ORGANIC ANTI-REFLECTIVE COATING LAYER AND COMPOSITION INCLUDING THE SAME

This application claims the priority benefit of Korean Patent Application No. 10-2006-0132668 filed on Dec. 22, 2006. All disclosure of the Korean Patent application is incorporated herein by reference.

FIELD OF THE INVENTION

This invention relates to a polymer for forming an organic anti-reflective coating layer and a composition comprising the same, and more specifically to a polymer for forming an organic anti-reflective coating layer, which has siloxane group at a main chain thereof, and a composition comprising the same.

BACKGROUNDS OF THE INVENTION

Recently, as the integration degree increase, ArF(193 nm) excimer laser of short wavelength is used as the exposure light source in order to improve the resolution of the photoresist pattern. However, as the wavelength of the exposure light is shorter, optical interference of the light reflected from the etching layer of the semi-conductor substrate during the exposure process, increases. In addition, due to undercutting, notching, etc., the photoresist pattern profile and the uniformity of thickness are deteriorated. To overcome these problems, the bottom anti-reflective coating (BARC) layer is conventionally formed between the etching layer and the photoresist layer to absorb the exposure light. The anti-reflective coating layer can be classified into the inorganic anti-reflective coating layer made of titanium, titanium dioxide, titanium nitride, chrome oxide, carbon, amorphous silicon, and so on, and the organic anti-reflective coating layer made of a polymer, which depends on the material for forming the anti-reflected coating layer. In comparison with the inorganic layer, the organic anti-reflective coating layer does not generally require complex and expensive apparatus such as a vacuum deposition equipment, a chemical vapor deposition (CVD) device, a sputter device and so on for forming the layer, and has a high absorptivity of a radioactive light, and is generally insoluble in a photoresist solvent. Also, even small materials thereof does not diffuse from the anti-reflective coating layer into a photoresist layer during coating, heating, and drying the photoresist layer, and the organic anti-reflective coating layer has an excellent etch rate in a dry etch process of a photolithography process. But until now, in the photolithography process using various radiations including ArF etc., the conventional composition for forming the organic anti-reflective coating layer is not satisfactory in its characteristics, such as the absorptivity of an exposure light.

SUMMARY OF THE INVENTION

Therefore, it is an object of the present invention to provide a polymer for forming an anti-reflective coating layer and a composition including the same, which have improved etch rate and refractive Index and prevent the undercutting and notching in the photolithography process which uses various radiations including ArF as exposure light source.

To accomplish the object, the present invention provides a polymer for forming an anti-reflective coating layer, represented by following Formula 1.

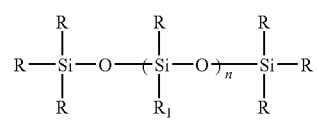

[Formula 1]

In Formula 1, R is hydrogen atom, $C_1 \sim C_{20}$ alkyl group, $C_1 \sim C_{10}$ alcohol group or epoxy group. $R_1$ is independently hydrogen atom,

and n is an integer of 1-50. $R_2$ is $C_1 \sim C_{20}$ alkyl group, $C_3 \sim C_{20}$ cycloalkyl group, $C_6 \sim C_{20}$ aryl group or $C_7 \sim C_{12}$ arylalkyl group. $R_3$ is hydrogen atom, $C_1 \sim C_{10}$ alcohol group or epoxy group and POSS is a polyhedral oligosilsesquioxane.

DETAILED DESCRIPTION OF THE INVENTION

Figure 1:
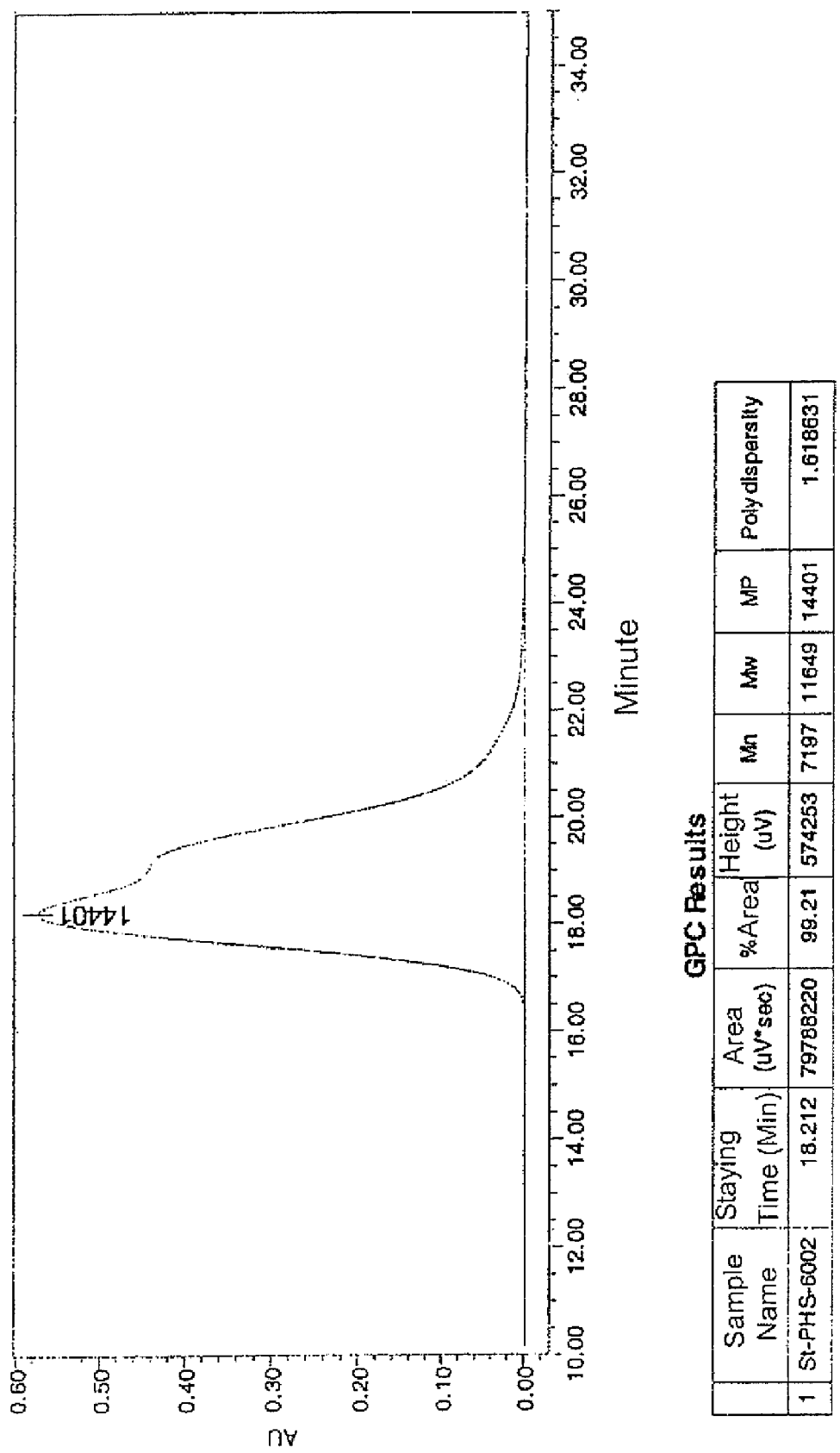
FIG. 1 illustrates GPC (Gel permeation chromatography) analysis graph of polymer for forming an organic anti-reflective coating layer which is manufactured according to one embodiment of the present invention.

A more complete appreciation of the invention, and many of the attendant advantages thereof, will be better appreciated by reference to the following detailed description.

A polymer for forming an organic anti-reflective coating layer according to the present invention is represented by following Formula 1.

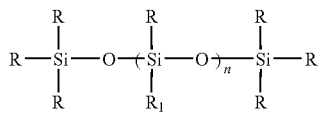

[Formula 1]

In Formula 1, R is hydrogen atom, $C_1 \sim C_{20}$ alkyl group, $C_1 \sim C_{10}$ alcohol group or epoxy group. $R_1$ is independently hydrogen atom,

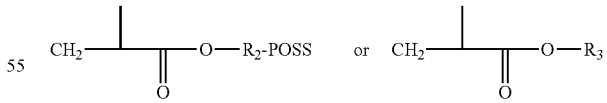

and n is an integer of 1-50. $R_2$ is $C_1 \sim C_{20}$ alkyl group, $C_3$-$C_{20}$ cycloalkyl group, $C_6 \sim C_{20}$ aryl group or $C_7 \sim C_{12}$ arylalkyl group. $R_3$ is hydrogen atom, $C_1 \sim C_{10}$ alcohol group or epoxy group, preferably hydrogen atom, propan-1-ol, butan-2-ol or 2-ethyl-oxirane. POSS is a three-dimensional molecular structure containing siloxane chains composed of Si/O groups and a structural formula thereof is $(SiO_{1.5})_x R_{x-1}$ ⁓ wherein x is 8, 10 or 12, R is H, OH, $C_1 \sim C_{20}$ alkyl group, alkene group, alkyne group, aryl group or alkoxyl group and the symbol ～ indicates a connecting bond. Specific examples of the POSS include

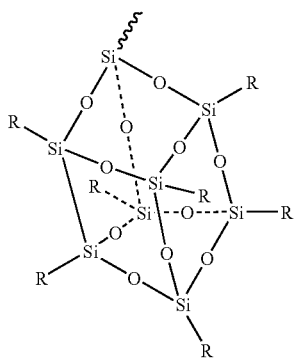

in which x is 8. Molecular weight of POSS used in the present invention is preferably 700 to 2550. Preferable example of polymers for forming an organic anti-reflective coating layer is a compound represented by following Formula 2.

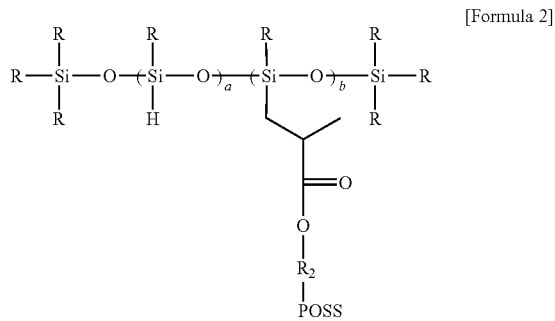

[Formula 2]

In Formula 2, R is as defined in Formula 1, preferably methyl group, $R_2$ is as defined as Formula 1, a and b independently represent mol % of repeating units constituting the polymer and are 1~99 mol % and 1~99 mol %.

Also, preferable example of compound of Formula 1 includes a compound represented by following Formula 3.

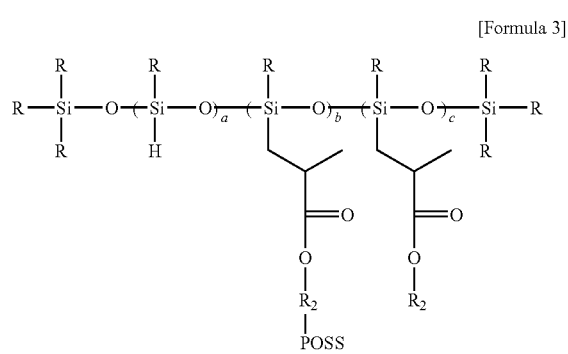

[Formula 3]

In Formula 3, R is as defined in Formula 1, preferably methyl group. $R_2$ and $R_3$ are as defined in Formula 1 and a, b and c independently represent mol % of repeating units constituting the polymer and are 1~98 mol %, 1~98 mol % and 1-98 mol %.

The weight-average molecular weight of the polymer represented by Formula 2 and Formula 3 is preferably 1,000 to 100,000. If the molecular weight is less than 1,000, the organic anti-reflective coating layer can be dissolved by a photoresist solvent. If the molecular weight is more than 100,000, a solubility of the polymer to a solvent might decrease, and the etch rate of the organic anti-reflective coating layer in a dry etch process might decrease.

The polymer represented by Formula 1 to Formula 3 has siloxane group at its main chain. Thus, the etch rate of the organic anti-reflective coating layer is improved and the organic anti-reflective coating layer has high refractive index which is very essential to the organic anti-reflective coating layer. The high refractive index decreases the thickness of the organic anti-reflective coating layer. Also, the repeating unit b of the polymer represented by Formula 2 has POSS group, so the organic anti-reflective coating layer has high refractive index. The repeating unit c of the polymer represented by Formula 3 has hydroxyl group or epoxy group which promotes cross-linking in hardening, so the cross-linking density is increased and the refractive index is improved.

At need, the polymer for forming an organic anti-reflective coating layer according to the present invention further includes a polymer of a cross-linking accelerator, represented by following Formula 4.

[Formula 4]

In Formula 4, m is an integer of 2 to 200. The polymer represented by Formula 4 contains phenyl group, so absorptivity to light at a specified wavelength region (193 nm) is very excellent to prevent non-uniform reflection. Since the polymer represented by Formula 4 contains hydroxyl group, cross-linking by the heating can be accelerated.

The polymer for forming an organic anti-reflective coating layer according to the present invention can be manufactured by the conventional polymerization, for example addition polymerization as shown in following Reaction Equation 1.

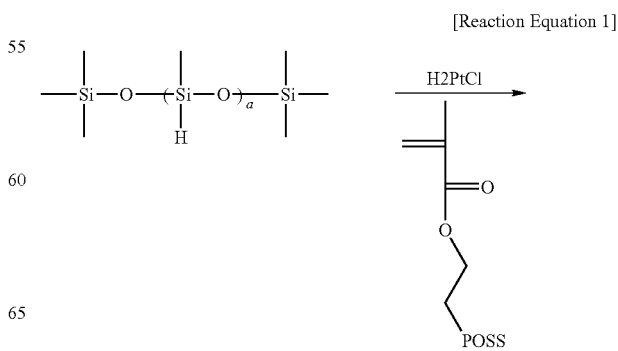

[Reaction Equation 1]

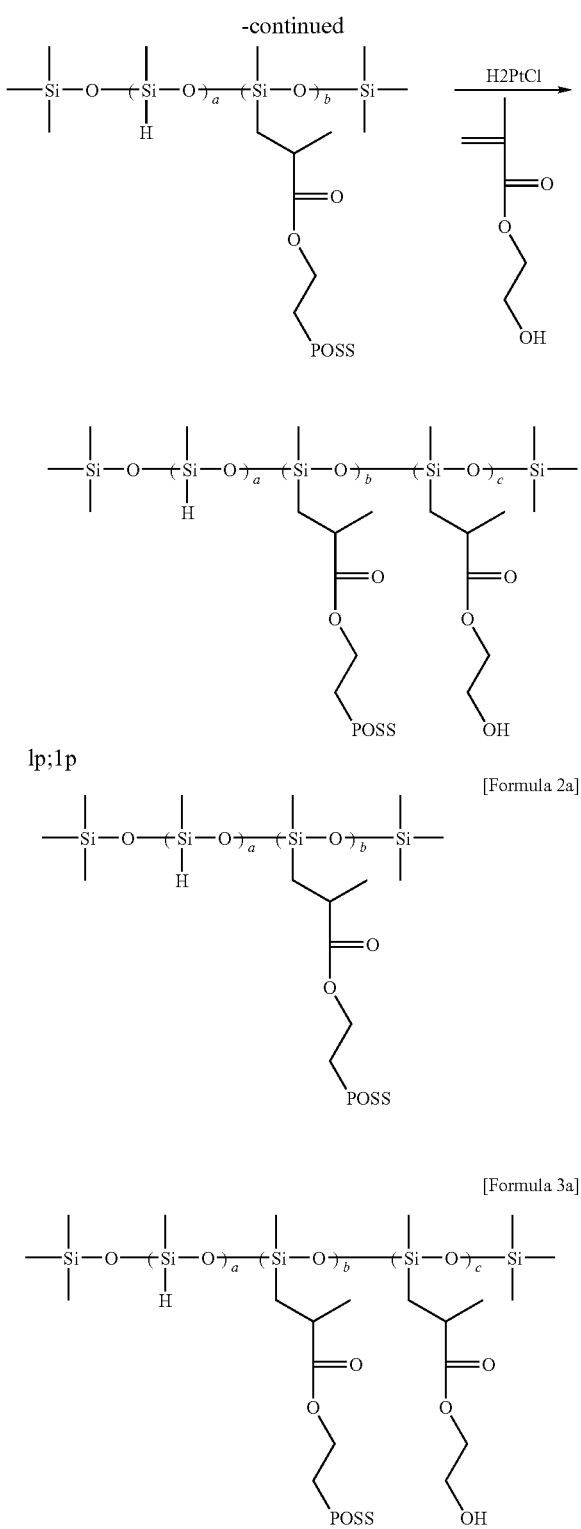

[Formula 2a]

[Formula 3a]

In Reaction Equation 1 firstly poly(methylhydrosiloxane) and POSS-ethylmethacrylate are added to an organic solvent, and reaction is performed at 90° C. under chloroplatinic acid ($H_2PtCl$) catalyst to obtain polymer represented by Formula 2a. Next, the organic solvent and hydroxy ethyl methacrylate are added to the obtained polymer and the reaction is performed at 90° C. under $H_2PtCl$ catalyst to obtain polymer represented by Formula 3a.

The composition for forming an organic anti-reflective coating layer according to the present invention includes a polymer represented by Formula 1, 2 or 3, a light absorber and a solvent. The composition for forming the organic anti-reflective coating layer according to the present invention can further include the second organic polymer which improves the coating characteristic of the composition, and can be cured by heating to increase the adhesion property of the organic anti-reflective coating layer. The non-limiting examples of such organic polymer include polymer or co-polymer of acrylate, methacrylate, styrene, hydroxy styrene, oxyalkylene, oxymethylene, amide, imide, ester, ether, vinylacetate, vinylether methyl, vinylether-maleric anhydride, and urethance. Other non-limiting examples include phenolic resin, epoxy resin, novolac resin, and the mixtures thereof.

The light absorber is to absorb various exposure light such as ArF(193 nm) which is reflected from an etching layer in a photolithography process, and thereby to prevent the problems such as a undercutting, a notching which may occur in a photoresist pattern. As the light absorber useful in the present invention, various conventional light absorbers can be used. The representative example of the light absorber can be represented by the following Formula 5, which is disclosed in Korean Patent Application No. 2004-76011, the content of which is included in this specification for reference.

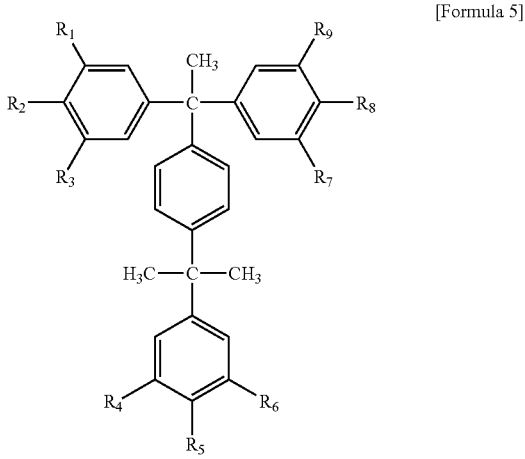

[Formula 5]

In Formula 5, $R_1$ to $R_9$ are independently hydrogen atom, hydroxyl group, halogen atom, nitro group, amino group, $C_1$~$C_8$ alkyl group with or without hydroxyl group, $C_1$~$C_8$ alkoxy group with or without carbonyl group, phenyl group, $C_5$~$C_{10}$ cycloalkyl group, aryl-alkyl group, alkyl-aryl group, and at least one of $R_1$ to $R_9$ is not hydrogen atom. Preferable example of compound represented by Formula 5 includes

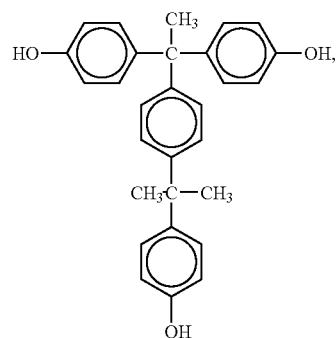
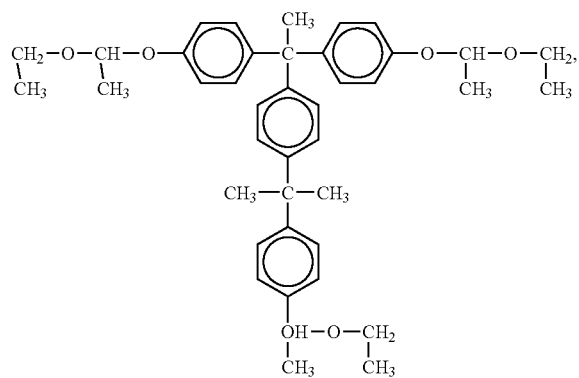
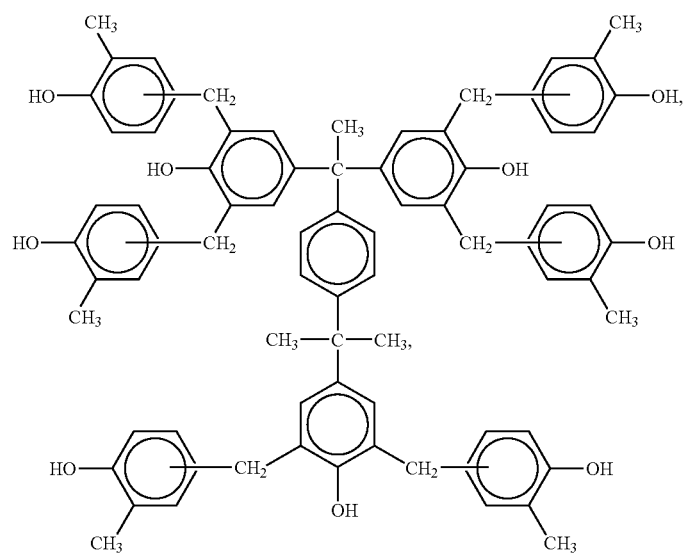
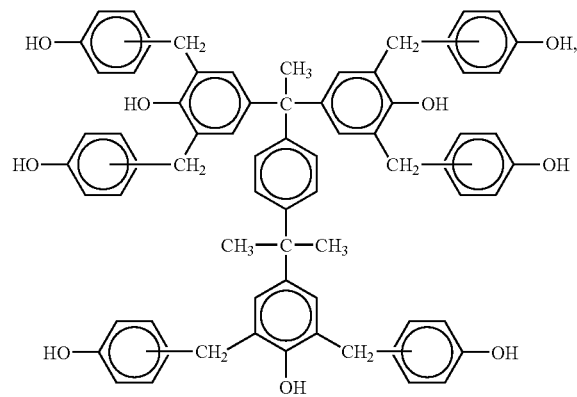
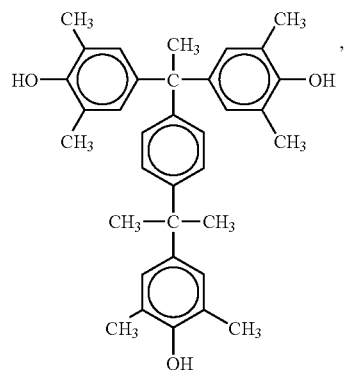

-continued
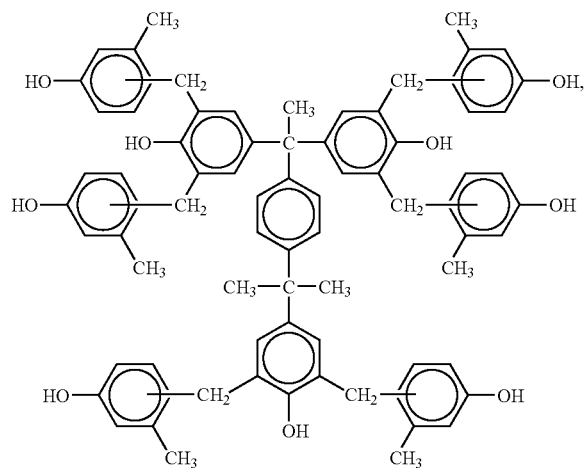
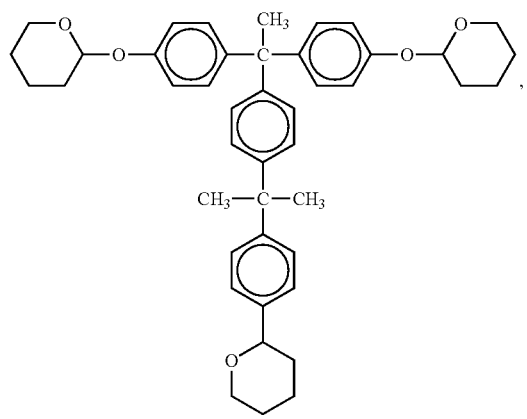
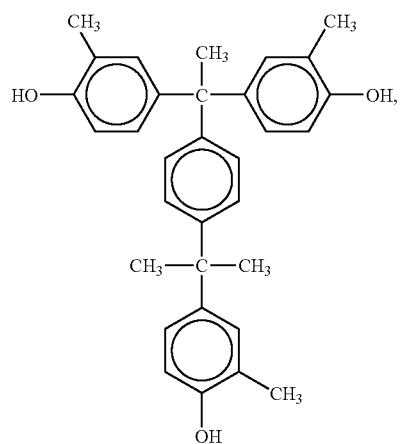
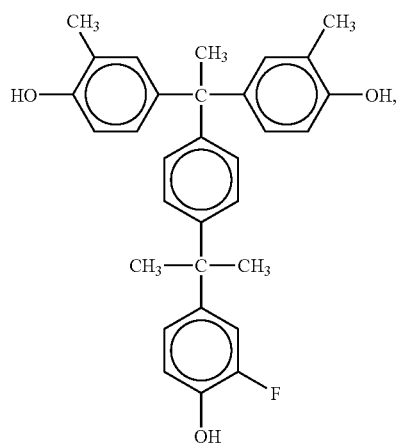
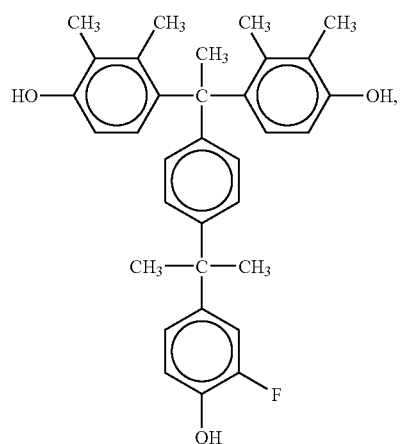
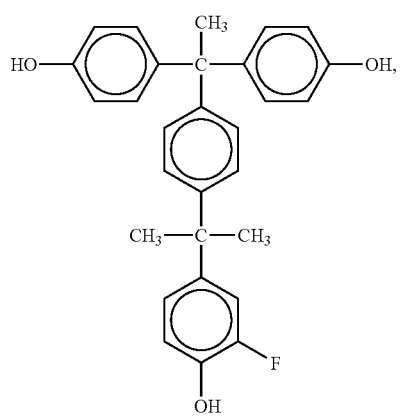

-continued
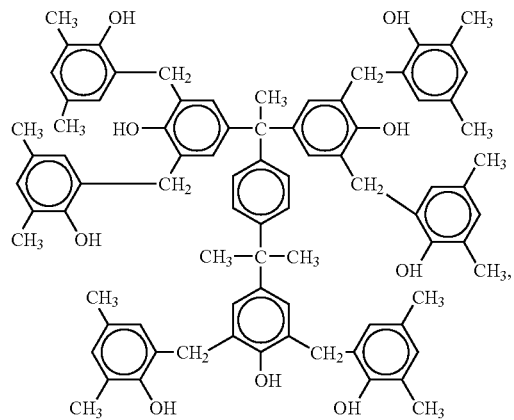
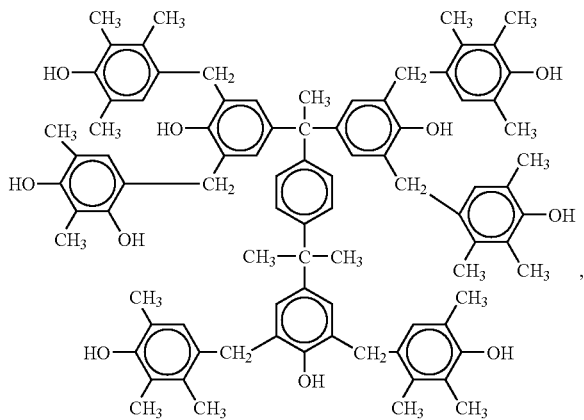
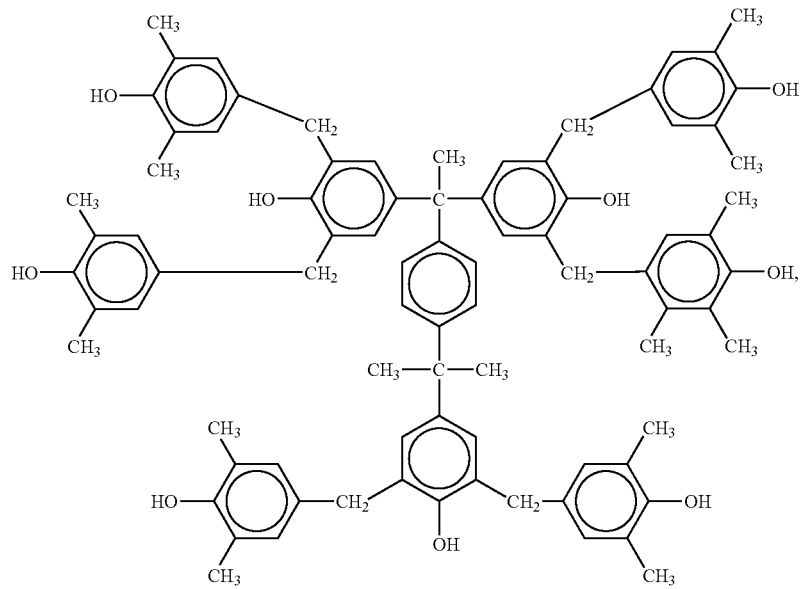
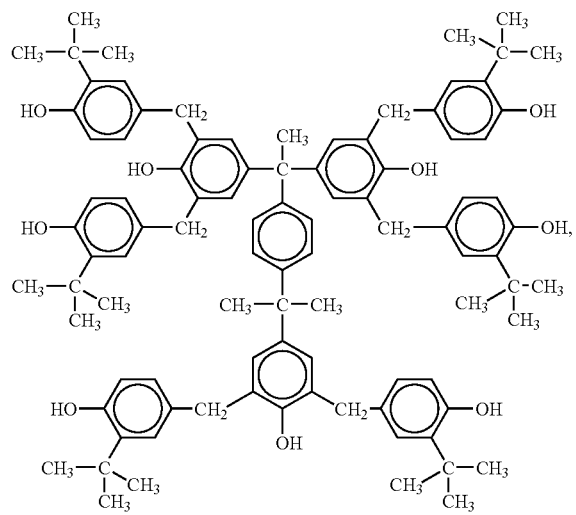
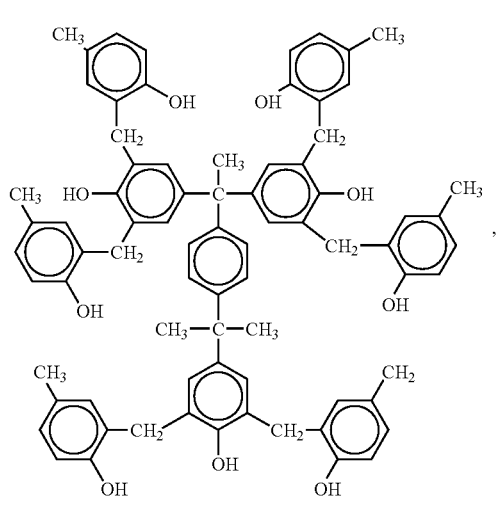

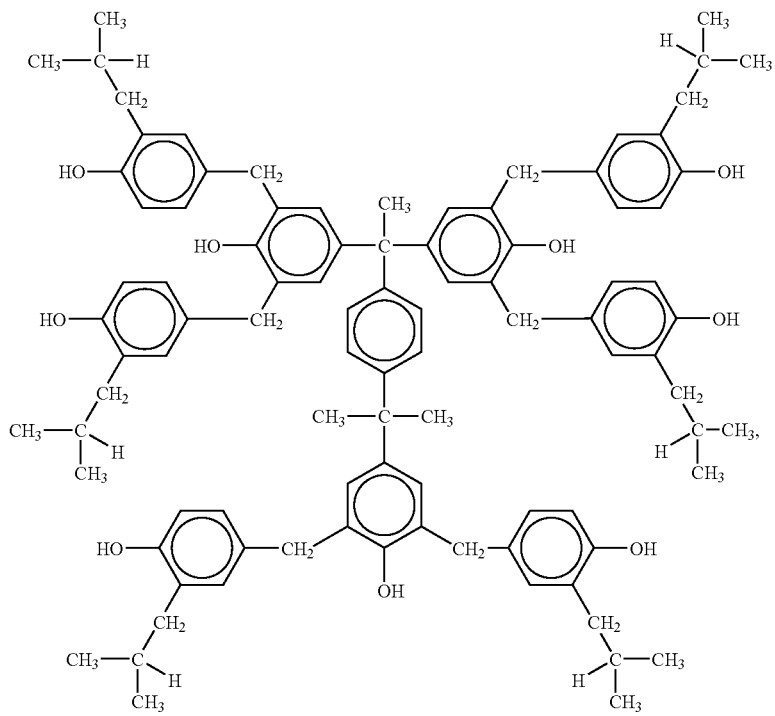
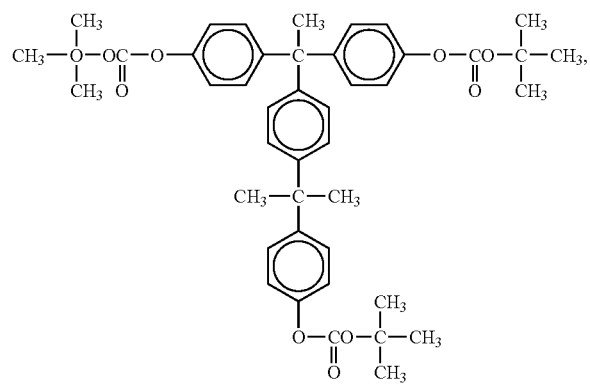
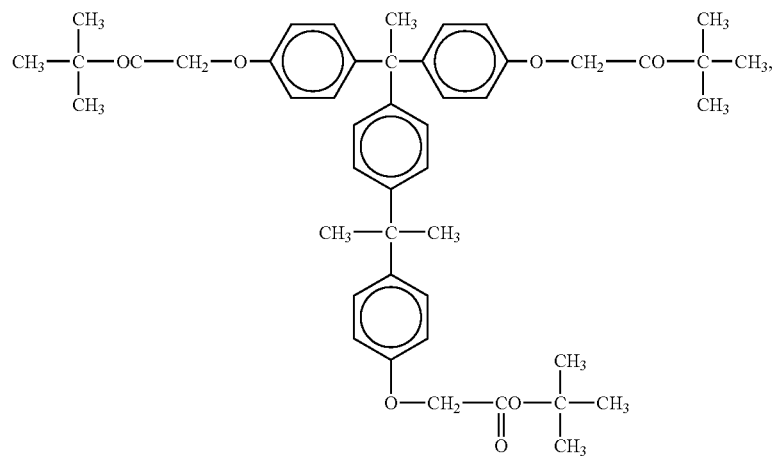

-continued

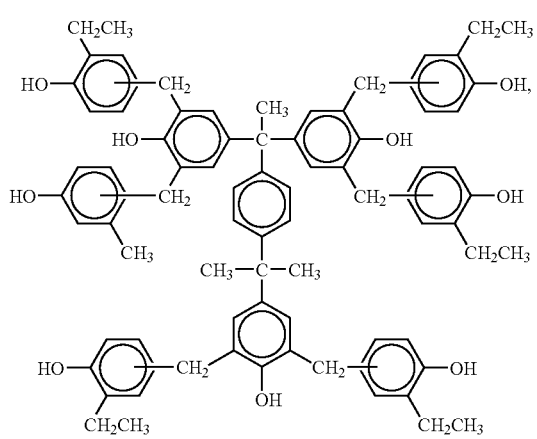
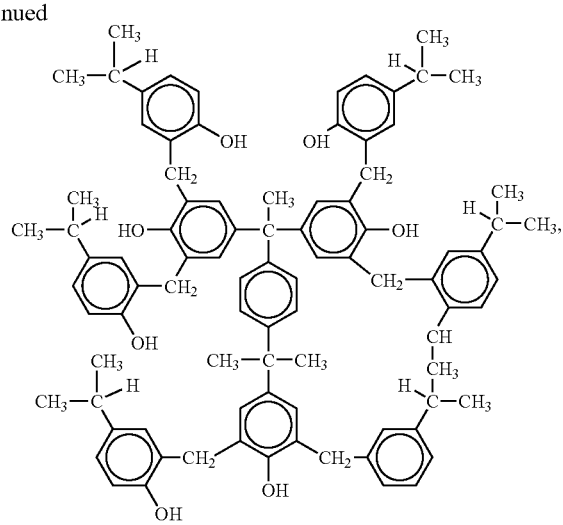

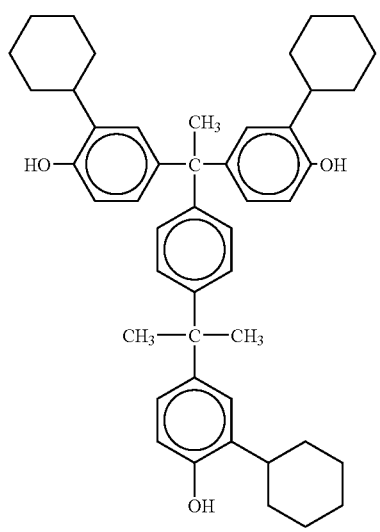

etc.

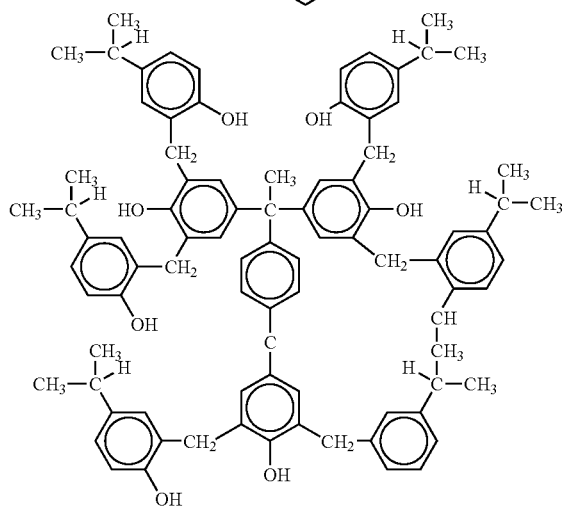

The amount of the light absorber is preferably 0.1 to 30 weight % with respect to the total amount of the composition for forming the organic anti-reflective coating layer. If the amount is less than 0.1 weight %, the undercutting and the notching in a photoresist pattern can be generated due to the low absorptivity of light reflected from the substrate of a semi-conductor. If the amount is more than 30 weight %, the coating apparatus can be spoiled due to the generation of fumes in a heating process. Also, due to the bulky structure of the light absorber, the organic anti-reflective coating layer does not contracted excessively. The light absorber also works as a plasticizer, which assists the composition's uniform coating even on a curved substrate. In addition, the light absorber has a good compatibility with a high molecular weight material such as a polymer, and has an excellent solubility to a solvent for forming the organic anti-reflective coating layer, and has a good reactivity with a cross-linking agent. Accordingly, a loss of thickness which may occur by a photoresist solvent can be prevented. The light absorber has an excellent absorptivity for an exposure light from ArF excimer laser, and thereby the light absorber can be effectively used for a semi-conductor substrate having a high reflectivity.

As the solvent, which is a component of the composition for forming the organic anti-reflective coating layer according to the prevent invention, various solvents which can conventionally used for manufacturing the composition for forming the organic anti-reflective coating layer can be widely used. The unlimited example of solvent includes butyrolactone, cyclopentanon, cyclohexanon, dimethyl acetamide, dimethyl formamide, dimethyl sulfoxide, N-methylpyrrolidone, tetrahydro furfural alcohol, propyleneglycol monomethylether(PGME), propyleneglycol monomethylether acetate(PGMEA), ethylactate and the mixtures thereof, and the more preferable solvent includes propyleneglycol monomethylether, propyleneglycol monomethylether acetate(PGMEA), ethylactate and the mixtures thereof. The amount of the solvent is preferably 40 to 99.8 weight % with respect to the total amount of the composition for forming the organic anti-reflective coating layer. If the amount is less than 40 weight %, the thickness of the organic anti-reflective coating layer may become non-uniform. If the amount is more than 99.8 weight %, the physical characteristic of the formed organic anti-reflective coating layer such as the absorbance of an exposure light may be deteriorated.

Also, the composition for forming the organic anti-reflective coating layer according to the present invention may further include a cross-linking accelerator such as a cross-linking agent, a low molecular weight alcohol, an acid, or an acid generator, a leveling agent, an adhesion promoter, an anti-foaming agent, and other various additives.

To form the organic anti-reflective coating layer with the composition of the present invention, the composition for forming the organic anti-reflective coating layer is applied on an etching layer, and the applied composition is cured by heating. The process of applying the composition for forming the organic anti-reflective coating layer is carried out by a conventional method such as spin coating, roller coating and so on. Also, the curing process is carried out by heating the applied composition in an apparatus such as a high-temperature plate, a convection oven, and so on. The curing process can be preferably carried out at high temperature, so that the cured organic anti-reflective coating layer may not be dissolved in an organic solvent of a photoresist composition or an aqueous alkaline developer. The preferable temperature of the curing process is 70° C. to 240° C. If the curing temperature is less than 70° C., the solvent included in the composition for forming the organic anti-reflective coating layer can be not removed sufficiently, and the cross-linking reaction can be not carried out sufficiently. If the curing temperature is more than 240° C., the organic anti-reflective coating layer and the composition for forming the same might become chemically unstable.

The method for forming a semi-conductor element pattern by using the composition for forming the organic anti-reflective coating layer according to the present invention comprises the steps of: applying the composition for forming the organic anti-reflective coating layer on an etching layer; forming the organic anti-reflective coating layer by curing, for example, by heat-curing the composition applied on the etching layer; forming a photoresist pattern by applying a photoresist composition on the organic anti-reflective coating layer to form a photoresist layer, exposing the photoresist layer to an exposure light of a predetermined pattern, and developing the exposed photoresist layer; and forming an etching pattern by etching the organic anti-reflective coating layer and the etching layer by using the formed photoresist pattern as a mask. Here, the process of forming the organic anti-reflective coating layer is described above. The photoresist pattern forming step is a conventional process and can be easily carried out by a skilled person in the art according to the photoresist composition. For example, the photoresist composition is applied or coated on the organic anti-reflective coating layer by a conventional method such as spin-coating, and the photoresist layer can be exposed to an exposure light through a photo-mask of a predetermined pattern. Also, the process of forming the photoresist pattern can include the step of baking the photoresist layer before or after the light exposing process, and the preferable baking temperature is 70° C. to 150° C. If the baking temperature is less than 70° C., the organic solvent in the photoresist composition may not be sufficiently evaporated and it is impossible to form the pattern because the PAG is sufficiently not diffused. If the baking temperature is more than 150° C., the diffusion of PAG is extremely active, so desired pattern cannot be obtained and the photoresist composition might be chemically unstable. The developing process can be carried out by using a conventional aqueous developer, and for example, by using the 0.1 to 10 weight % of sodium hydroxide, potassium hydroxide, sodium carbonate or TMAH (tetramethyl ammonium hydroxide) solution. The aqueous organic solvent such as methanol or ethanol etc, and surfactant are added to the developer. Also, after developing process, the exposed photoresist pattern is washed with purified water. Finally, the organic anti-reflective coating layer and the etching layer are etched by using the formed photoresist pattern as a mask to form the etching layer pattern. The etching process can be carried out by a conventional dry etching process. The semi-conductor element pattern is formed by etching the organic anti-reflective coating layer and the etching layer.

Hereinafter, the preferable examples are provided for better understanding of the present invention. However, the present invention is not limited to the following examples. POSS used in following examples was

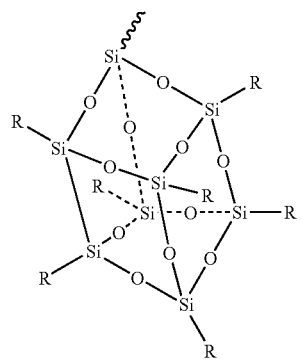

(R is methyl group ($CH_3$)).

EXAMPLE 1-1

Preparation of Polymer Represented by Formula 2a 30 g (0.0333 mol) of poly(methylhydrosiloxane) (item no-176206 of Aldrich company) and 1 l of toluene and 5 g (0.00549 mol) of compound represented by Formula 1a were added into 2 l reactor in which a magnetic stirring rod was provided, and the reaction solution was heated to 90° C. Next, 50 μl of H₂PtCl (catalyst) was slowly added to the reaction solution and the reaction was performed for 24 hours. After the completion of the reaction, the product from the reaction was precipitated by water and filtered and then the filtered was dissolved in tetrahydrofurane(THF). To remove residual H₂PtCl, column was proceeded to finally obtain 20 g of polymer represented by following Formula 2a with 57% yield (a:b=80:20, Mw=12,500, PD=1.78).

[Formula 1a]

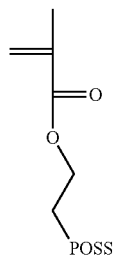

[Formula 2a]

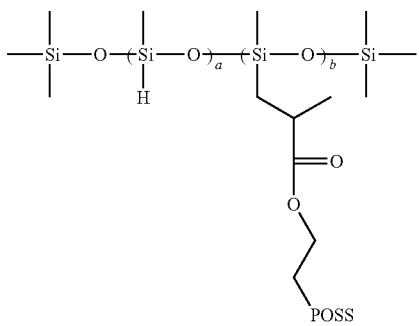

EXAMPLE 1-2

Preparation of Polymer Represented by Formula 2b

Except for using 5 g (0.00518 mol) of compound in Formula 1b instead of 5 g of compound in Formula 1a, 18 g of polymer represented by Formula 2b was prepared with yield 51% in the same manner described in Example 1-1 (a:b=78:22, Mw=12,500, PD=1.76).

[Formula 1b]

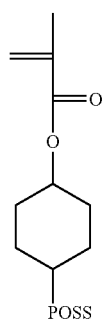

[Formula 2b]

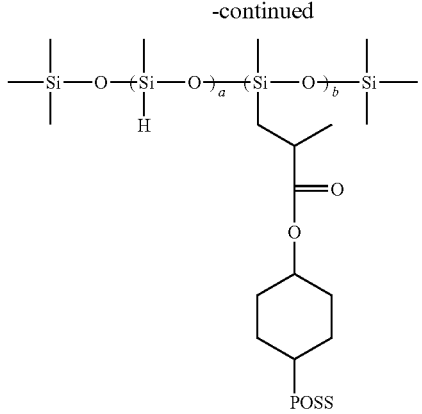

EXAMPLE 1-3

Preparation of Polymer Represented by Formula 2c

Except for using 5 g (0.00521 mol) of compound in Formula 1c instead of 5 g of compound in Formula 1a, 22 g of polymer represented by Formula 2c was prepared with yield 63% in the same manner described in Example 1-1 (a:b=75:25, Mw=11,900, PD=1.77).

[Formula 1c]

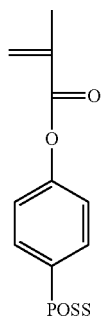

[Formula 2c]

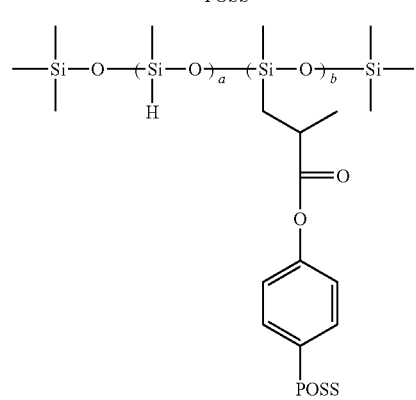

EXAMPLE 1-4

Preparation of Polymer Represented by Formula 2d

Except for using 5 g (0.00477 mol) of compound in Formula 1d instead of 5 g of compound in Formula 1a, 19 g of polymer represented by Formula 2d was prepared with yield 54% in the same manner described in Example 1-1 (a:b=82:18, Mw=10,800, PD=1.80).

[Formula 1d]

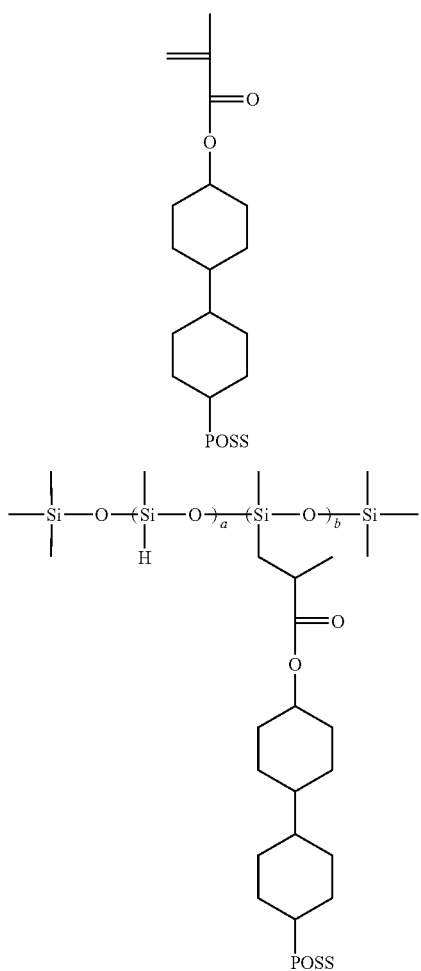

[Formula 2d]

EXAMPLE 1-5

Preparation of Polymer Represented by Formula 2e

Except for using 5 g (0.00483 mol) of compound in Formula 1e instead of 5 g of compound in Formula 1a, 15 g of polymer represented by Formula 2e was prepared with yield 43% in the same manner described in Example 1-1 (a:b=80:20, Mw=12,200, PD=1.75).

[Formula 1e]

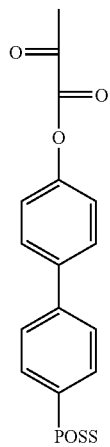

[Formula 2e]

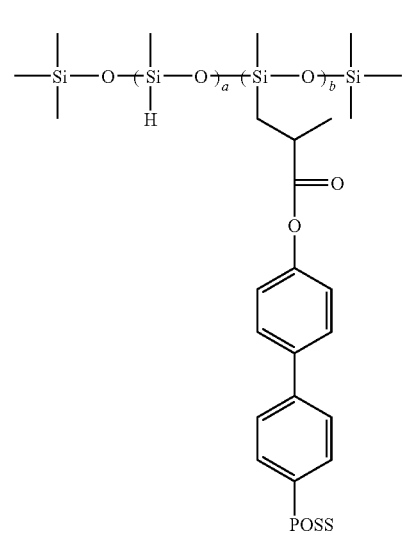

EXAMPLE 1-6

Preparation of Polymer Represented by Formula 2f

Except for using 5 g (0.00489 mol) of compound in Formula 1f instead of 5 g of compound in Formula 1a, 21 g of polymer represented by Formula 2f was prepared with yield 60% in the same manner described in Example 1-1 (a:b=78:22, Mw=9,900, PD=1.74).

[Formula 1f]

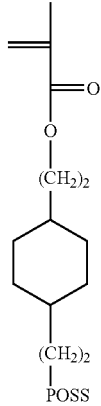

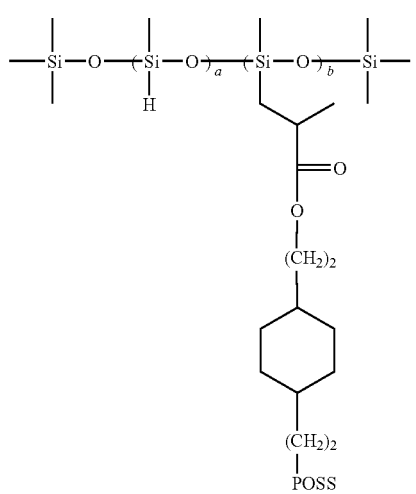

[Formula 2f]

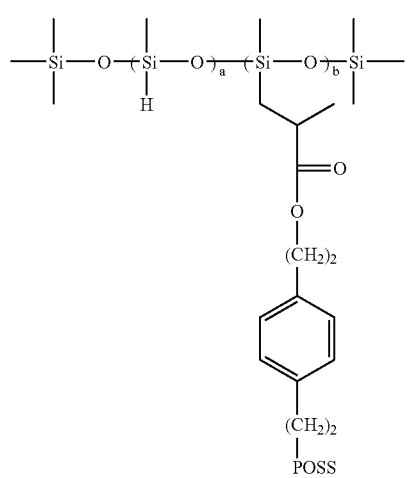

[Formula 2g]

EXAMPLE 1-7

Preparation of Polymer Represented by Formula 2g

Except for using 5 g (0.00492 mol) of compound in Formula 1g instead of 5 g of compound in Formula 1a, 20 g of polymer represented by Formula 2g was prepared with yield 57% in the same manner described in Example 1-1 (a:b=75:25, Mw=11,500, PD=1.80).

EXAMPLE 1-8

Preparation of Polymer Represented by Formula 2 h

Except for using 5 g (0.00453 mol) of compound in Formula 1 h instead of 5 g of compound in Formula 1a, 18 g of polymer represented by Formula 2 h was prepared with yield 51% in the same manner described in Example 1-1 (a:b=83:17, Mw=10,200, PD=1.79).

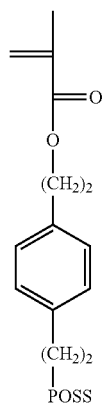

[Formula 1g]

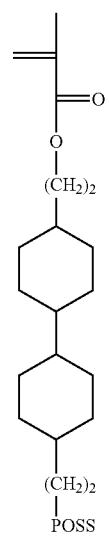

[Formula 1h]

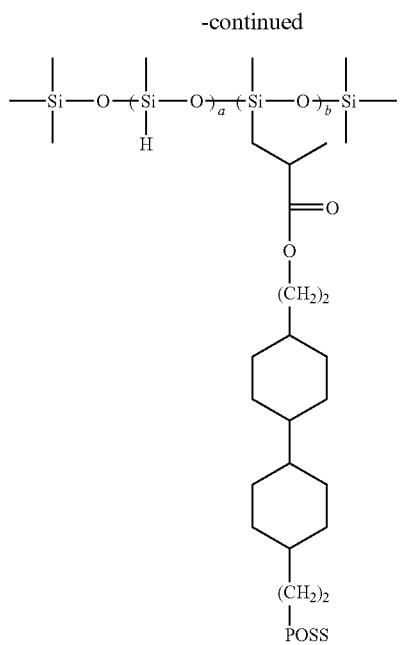

[Formula 2h]

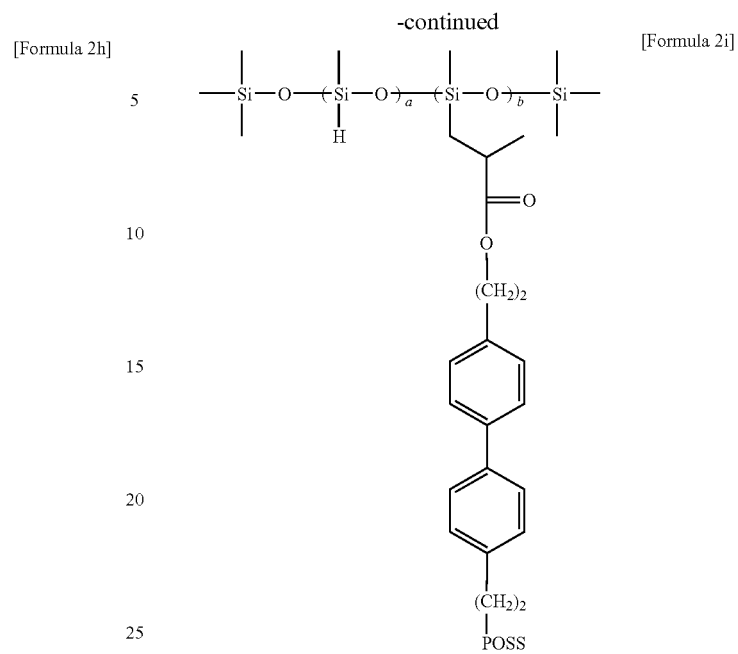

[Formula 2i]

EXAMPLE 1-9

Preparation of Polymer Represented by Formula 2i

Except for using 5 g (0.0060 mol) of compound in Formula 1i instead of 5 g of compound in Formula 1a, 19 g of polymer represented by Formula 2l was prepared with yield 54% in the same manner described in Example 1-1 (a:b=80:20, Mw=11,500, PD=1.75).

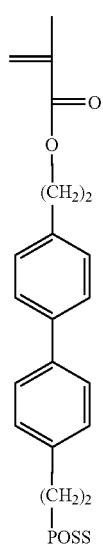

[Formula 1i]

EXAMPLE 2-1

Preparation of Polymer Represented by Formula 3a 20 g of polymer (Formula 2a) obtained in Example 1-1, 1 l of toluene and 10 g (0.077 mol) of hydroxy ethyl methacrylate were added into 2 l reactor in which a magnetic stirring rod was provided, and the reaction solution was heated to 90° C. Next, 50 µl of $H_2PtCl$ (catalyst) was slowly added to the reaction solution and the reaction was performed for 24 hours. After the completion of the reaction, the product from the reaction was precipitated by water and filtered and then the filtered was dissolved in tetrahydrofurane(THF). To remove residual $H_2PtCl$, column was proceeded to finally obtain 18 g of polymer represented by following Formula 3a with 80% yield. The weight-average molecular weight (Mw) and polydispersity (PDI) of the produced polymer were measured by GPC (Gel Permeation Chromatography) and the results are shown in the following Table 1 (Mw=11,600, PD=1.62).

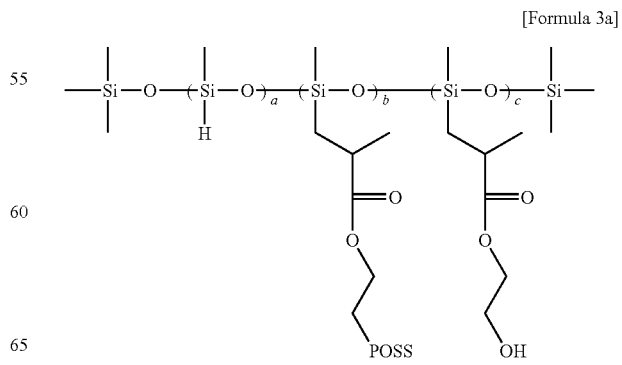

[Formula 3a]

EXAMPLE 2-2

Preparation of Polymer Represented by Formula 3b

Except for using 20 g of polymer in Formula 2b and 10 g (0.069 mol) of 2-hydroxy-propyl methacrylate instead of 20 g of polymer in Formula 2a and 10 g of hydroxy ethyl methacrylate, 22.5 g of polymer represented by Formula 3b was prepared with yield 75% in the same manner described in Example 2-1 (Mw=11,500, PD=1.82).

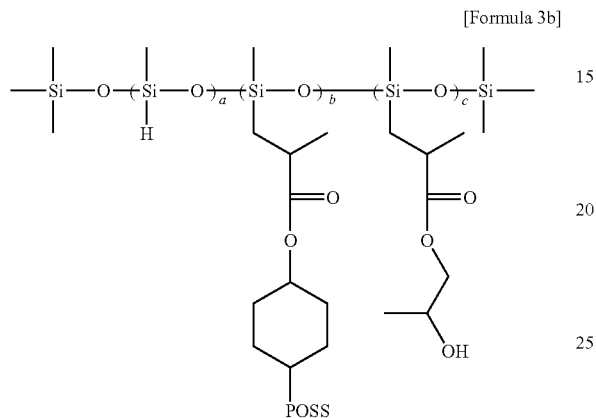

[Formula 3b]

EXAMPLE 2-3

Preparation of Polymer Represented by Formula 3c

Except for using 20 g of polymer in Formula 2c and 10 g (0.078 mol) of epoxy methacrylate instead of 20 g of polymer in Formula 2a and 10 g of hydroxy ethyl methacrylate, 20.7 g of polymer represented by Formula 3c was prepared with yield 69% in the same manner described in Example 2-1 (Mw=10,200, PD=1.68).

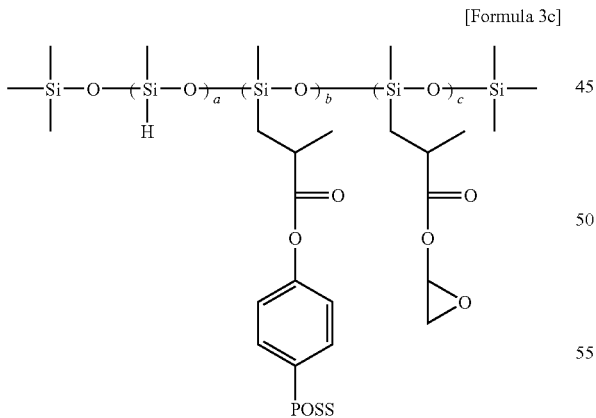

[Formula 3c]

EXAMPLE 2-4

Preparation of Polymer Represented by Formula 3d

Except for using 20 g of polymer in Formula 2d instead of 20 g of polymer in Formula 2a, 22.5 g of polymer represented by Formula 3d was prepared with yield 75% in the same manner described in Example 2-1 (Mw=9,800, PD=1.77).

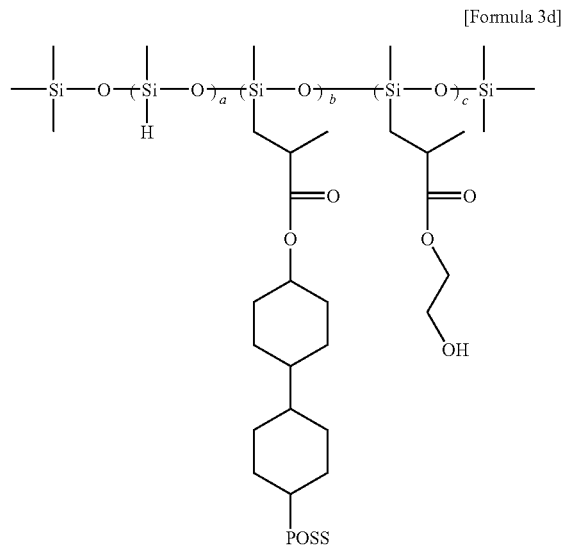

[Formula 3d]

EXAMPLE 2-5

Preparation of Polymer Represented by Formula 3e

Except for using 20 g of polymer in Formula 2e and 10 g (0.069 mol) of 2-hydroxy-propyl methacrylate instead of 20 g of polymer in Formula 2a and 10 g of hydroxy ethyl methacrylate, 19.8 g of polymer represented by Formula 3e was prepared with yield 66% in the same manner described in Example 2-1 (Mw=9,600, PD=1.86).

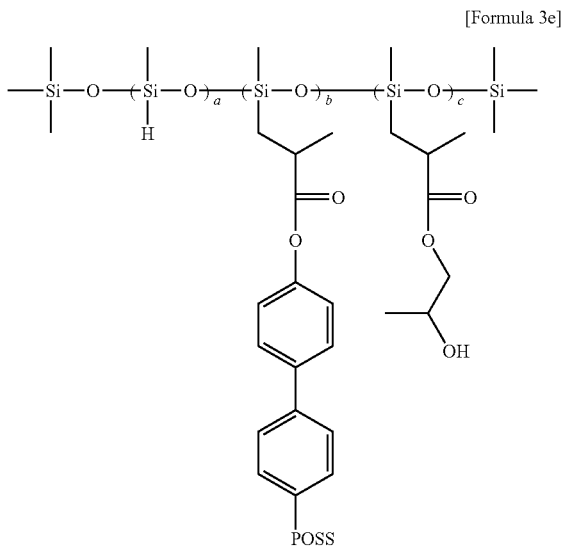

[Formula 3e]

EXAMPLE 2-6

Preparation of Polymer Represented by Formula 3f

Except for using 20 g of polymer in Formula 2f and 10 g (0.078 mol) of epoxy methacrylate instead of 20 g of polymer in Formula 2a and 10 g of hydroxy ethyl methacrylate, 21.6 g of polymer represented by Formula 3f was prepared with yield 72% in the same manner described in Example 2-1 (Mw=10,500, PD=1.86).

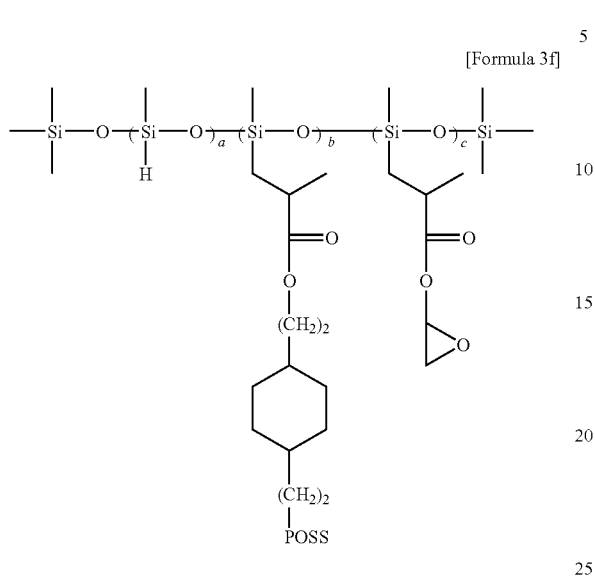

[Formula 3f]

EXAMPLE 2-7

Preparation of Polymer Represented by Formula 3g

Except for using 20 g of polymer in Formula 2g instead of 20 g of polymer in Formula 2a, 19.5 g of polymer represented by Formula 3g was prepared with yield 65% in the same manner described in Example 2-1 (Mw=11,200, PD=1.69).

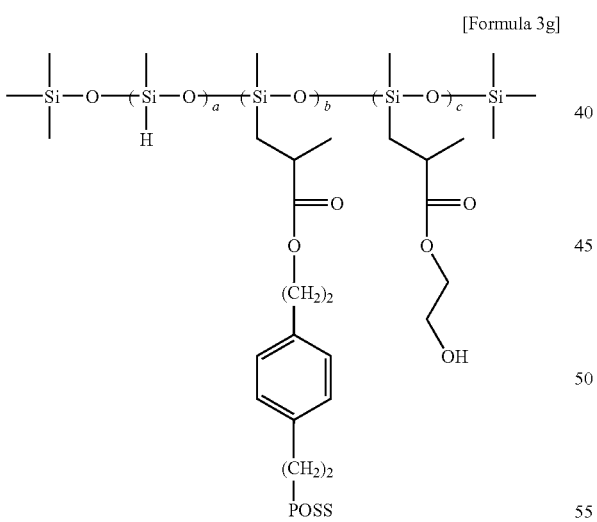

[Formula 3g]

EXAMPLE 2-8

Preparation of Polymer Represented by Formula 3h

Except for using 20 g of polymer in Formula 2h and 10 g (0.069 mol) of 2-hydroxy-propyl methacrylate instead of 20 g of polymer in Formula 2a and 10 g of hydroxy ethyl methacrylate, 21 g of polymer represented by Formula 3h was prepared with yield 70% in the same manner described in Example 2-1 (Mw=10,900, PD=1.73).

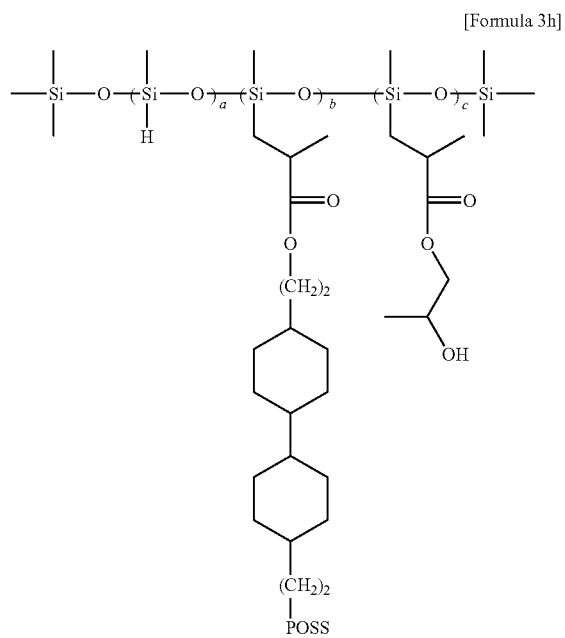

[Formula 3h]

EXAMPLE 2-9

Preparation of Polymer Represented by Formula 3i

Except for using 20 g of polymer in Formula 2i and 10 g (0.078 mol) of epoxy methacrylate instead of 20 g of polymer in Formula 2a and 10 g of hydroxy ethyl methacrylate, 21.9 g of polymer represented by Formula 3l was prepared with yield 73% in the same manner described in Example 2-1 (Mw=9,900, PD=1.85).

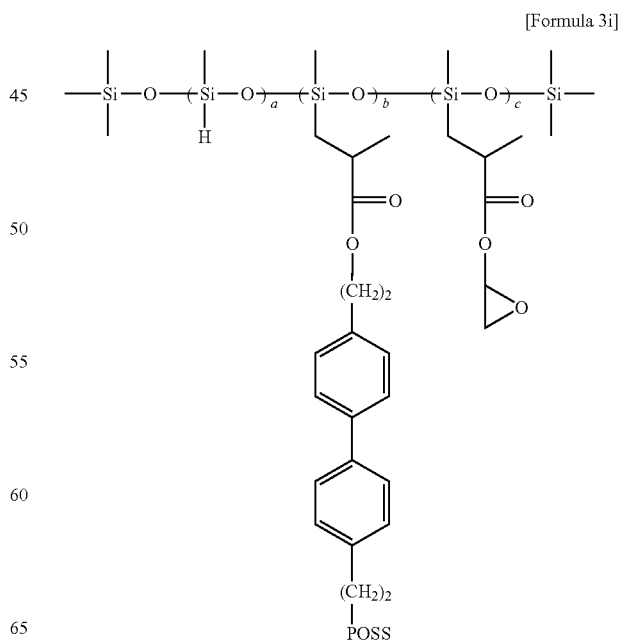

[Formula 3i]

EXAMPLE 2-10

Preparation of Polymer Represented by Formula 3j

Except for using 20 g of polymer in Formula 2c and 10 g (0.069 mol) of 2-hydroxy-propyl methacrylate instead of 20 g of polymer in Formula 2a and 10 g of hydroxy ethyl methacrylate, 21.3 g of polymer represented by Formula 3j was prepared with yield 71% in the same manner described in Example 2-1 (Mw=12,500, PD=1.88).

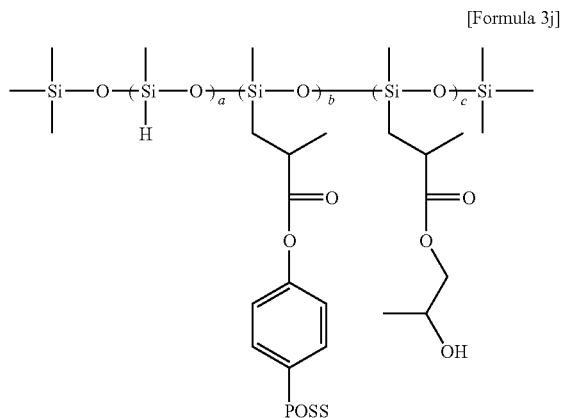

[Formula 3j]

EXAMPLE 3-1 TO EXAMPLE 3-10

Preparation of Composition for Forming an Organic Anti-Reflective Coating Layer Containing One of Polymers Manufactured in Example 2-1 to Example 2-10

0.13 g of one of polymers (Formula 3a to Formula 3j) manufactured in Example 2-1 to Example 2-10, 0.091 g of light absorber represented by Formula 5a, 0.06 g of polyvinyl phenol as an cross-linking agent and 0.01 g of 2-hydroxyhexyl p-toluenesulfonate as an acid-generator were dissolved in 13.7 g of PGMEA (propylene glycol monomethyl ether acetate), and stirred to obtain compositions for forming the organic anti-reflective coating layer.

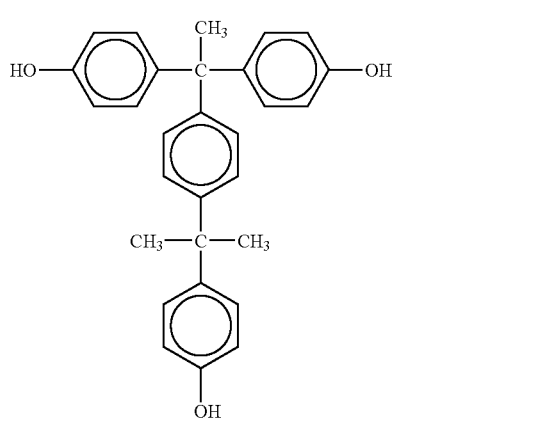

[Formula 5a]

TEST EXAMPLE 1

Stripping Test of the Organic Anti-Reflective Coating Layer

The respective composition for forming an organic anti-reflective coating layer prepared in Example 3-1 to Example 3-10 was uniformly applied on a silicon substrate with a thickness of 240 Å, and was cured at 240° C. for 90 seconds to form an organic anti-reflective coating layer. After measuring the thickness of the organic anti-reflective coating layer, the organic anti-reflective coating layer was dipped in a respective solvent of PGMEA, PGME, EL and nBA for 60 seconds. Next the substrate was spin with the spinning speed of 2000 rpm for 30 seconds and dried at the heating-plate at 100° C. for 60 seconds. Then the thickness of the organic anti-reflective coating layer was measured again and the results thereof are shown in Table 1. Also, the refractive index (n) and the absorptivity (k) at 193 nm were measured by using Ellipsometer and the results thereof are shown in Table 1.

TABLE 1

|  | n | K | Film Loss(with respect to respective solvent) |
|---|---|---|---|
| Example 3-1 (Formula 3a) | 1.65 | 0.42 | None |
| Example 3-2 (Formula 3b) | 1.60 | 0.50 | None |
| Example 3-3 (Formula 3c) | 1.58 | 0.52 | None |
| Example 3-4 (Formula 3d) | 1.65 | 0.49 | None |
| Example 3-5 (Formula 3e) | 1.68 | 0.50 | None |
| Example 3-6 (Formula 3f) | 1.69 | 0.40 | None |
| Example 3-7 (Formula 3g) | 1.65 | 0.48 | None |
| Example 3-8 (Formula 3h) | 1.69 | 0.53 | None |
| Example 3-9 (Formula 3i) | 1.69 | 0.49 | None |
| Example 3-10 (Formula 3j) | 1.58 | 0.43 | None | n: real part(refractive index at 193 nm)
K: imaginary part(absorptivity at 193 nm)

As shown in Table 1, the composition for forming an organic anti-reflective coating layer has no loss in view of thickness as well as good refractive index and absorptivity. Thus the stripping-resistance thereof is superior.

In general, when k is less than a certain value (k<0.3) at a given wavelength, the absorptivity is decreased, and the undercutting and the notching, etc can be generated due to the non-uniform reflection. Thus, the photoresist pattern profile is deteriorated. On the contrary, when k is more than a certain value (for example, k>0.7), the absorptivity excessively increases, and the sensitivity of photoresist may be deteriorated. Thus, the throughput of the semiconductor production can be deteriorated. As n increases (for example, n>1.8), the thickness of the organic anti-reflective coating layer can be reduced. So the resolution of 45 nm pattern which is finer than L/S pattern size (65 nm) of currently possible resolution can be accomplished. Thus, the composition of the present invention is applicable to ArF immersion process. On the contrary, as n decreases (for example, n<1.4), the thickness of the organic anti-reflective coating layer should be thickened and there is a problem that the etch rate becomes very slow.

As shown described above, the polymer for forming an organic anti-reflective coating layer according to the present invention has a high absorptivity of an exposure light from ArF excimer laser, and the generation of standing wave, undercutting and notching can be prevented to obtain the

The invention claimed is:

1. A polymer for forming an anti-reflective coating layer, represented by following Formula 3:

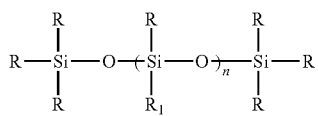

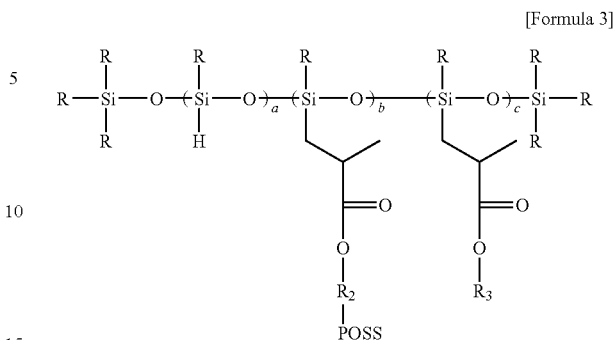

in Formula 3, R is hydrogen atom, $C_1$~$C_{20}$ alkyl group, $C_1$~$C_{10}$ alcohol group or epoxy group, $R_2$ is $C_1$~$C_{20}$ alkyl group, $C_3$~$C_{20}$ cycloalkyl group, $C_6$~$C_{20}$ aryl group or $C_7$~$C_{12}$ arylalkyl group, $R_3$ is hydrogen atom, $C_1$~$C_{10}$ alcohol group or epoxy group and POSS is a polyhedral oligosilsesquioxane, a, b and c independently represent mol % of repeating units constituting the polymer and are 1~98mol %, 1~98mol % and 1~98mol %.

* * * * *

UNITED STATES PATENT AND TRADEMARK OFFICE
CERTIFICATE OF CORRECTION

PATENT NO. : 7,829,650 B2  
APPLICATION NO. : 11/952324  
DATED : November 9, 2010  
INVENTOR(S) : Sang-Jeoung Kim et al.

Page 1 of 1

It is certified that error appears in the above-identified patent and that said Letters Patent is hereby corrected as shown below:

IN THE CLAIMS:

Col. 33, claim 1, immediately after the second line thereof (lines 20-25), delete the following formula:

" 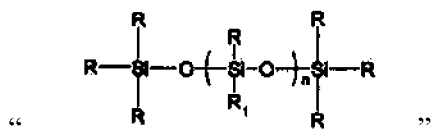 "

Signed and Sealed this
Fifteenth Day of February, 2011

David J. Kappos
*Director of the United States Patent and Trademark Office*